(12) United States Patent
Sim et al.

(10) Patent No.: US 11,516,932 B2
(45) Date of Patent: Nov. 29, 2022

(54) FOLDABLE DISPLAY DEVICE

(71) Applicants: SAMSUNG DISPLAY CO., LTD., Yongin-si (KR); FINE DNC CO., LTD, Asan-si (KR)

(72) Inventors: Jin Yong Sim, Seongnam-si (KR); Chang Soo Kim, Incheon (KR); Se Yong Kim, Gimpo-si (KR); Sung Chun Hong, Seoul (KR)

(73) Assignees: SAMSUNG DISPLAY CO., LTD., Yongin-si (KR); FINE DNC CO., LTD., Asan-si (KR)

( * ) Notice: Subject to any disclaimer, the term of this patent is extended or adjusted under 35 U.S.C. 154(b) by 97 days.

(21) Appl. No.: 16/879,993

(22) Filed: May 21, 2020

(65) Prior Publication Data

US 2020/0375046 A1 Nov. 26, 2020

(30) Foreign Application Priority Data

May 23, 2019 (KR) ........................ 10-2019-0060773

(51) Int. Cl.
*H05K 5/02* (2006.01)
*E05D 3/12* (2006.01)
*E05D 7/00* (2006.01)
*H05K 5/00* (2006.01)
*E05D 11/00* (2006.01)

(52) U.S. Cl.
CPC ........... *H05K 5/0226* (2013.01); *E05D 3/122* (2013.01); *E05D 7/00* (2013.01); *E05D 11/0054* (2013.01); *H05K 5/0017* (2013.01); *E05Y 2900/606* (2013.01)

(58) Field of Classification Search
CPC ....... E05D 3/122; E05D 7/00; E05D 11/0054; H05K 5/0017; H05K 5/0226; E05Y 2900/606
See application file for complete search history.

(56) References Cited

U.S. PATENT DOCUMENTS 8,938,855 B2* 1/2015 Ahn ...................... H04M 1/022
16/354
9,677,308 B1* 6/2017 Chen ..................... G06F 1/1681
(Continued)

FOREIGN PATENT DOCUMENTS

KR 10-2014-0091272 7/2014
KR 10-2014-0091273 7/2014
(Continued)

*Primary Examiner* — Victor D Batson
*Assistant Examiner* — Matthew J Sullivan
(74) *Attorney, Agent, or Firm* — F. Chau & Associates, LLC

(57) ABSTRACT

A foldable display device includes a hinge, a support plate connected to opposite ends of the hinge and a display panel module disposed on the support plate. The hinge includes a rotation axis module having a rotation axis. A first slider is connected to the rotation axis and includes a first guide line. A second slider is connected to the support plate and includes a second guide line. A link arm includes a link arm body. The link arm body has a link arm rotation axis disposed at a first end of the link arm body and a link arm pin hole disposed at a second end of the link arm body. A link arm pin is configured to extend through the link arm pin hole, the first guide line and the second guide line.

21 Claims, 24 Drawing Sheets

(56) References Cited

U.S. PATENT DOCUMENTS

| | | | |
|---|---|---|---|
| 9,848,502 B1* | 12/2017 | Chu | E05D 11/1078 |
| 10,036,188 B1* | 7/2018 | Yao | H05K 5/0226 |
| 10,520,988 B2* | 12/2019 | Hsu | E05D 3/12 |
| 10,761,573 B2* | 9/2020 | Hsu | G06F 1/1681 |
| 10,761,574 B1* | 9/2020 | Hsu | E05D 7/00 |
| 10,824,197 B1* | 11/2020 | Hsu | G06F 1/1616 |
| 10,845,850 B1* | 11/2020 | Kang | H04M 1/022 |
| 11,194,365 B2* | 12/2021 | Lin | E05D 11/082 |
| 2011/0289728 A1* | 12/2011 | Wang | G06F 1/1681 16/337 |
| 2012/0042473 A1* | 2/2012 | Wang | G06F 1/1681 16/319 |
| 2012/0096678 A1* | 4/2012 | Zhang | G06F 1/1681 16/302 |
| 2020/0063476 A1* | 2/2020 | Lin | E05D 3/122 |
| 2020/0267856 A1* | 8/2020 | Hsu | H05K 5/0017 |
| 2020/0293094 A1* | 9/2020 | Liu | G06F 1/1681 |
| 2021/0165466 A1* | 6/2021 | Kang | E05D 3/18 |
| 2021/0271294 A1* | 9/2021 | Liao | G06F 1/1652 |
| 2021/0373612 A1* | 12/2021 | Hwang | F16C 11/04 |
| 2021/0396056 A1* | 12/2021 | Lin | E05D 3/122 |
| 2021/0396455 A1* | 12/2021 | Jang | E05D 11/0054 |
| 2021/0405711 A1* | 12/2021 | Morrison | H01F 7/081 |

FOREIGN PATENT DOCUMENTS

| | | |
|---|---|---|
| KR | 10-2014-0091274 | 7/2014 |
| KR | 10-2016-0087972 | 7/2016 |
| KR | 10-2017-0003801 | 1/2017 |
| KR | 10-2017-0087000 | 7/2017 |
| KR | 10-2017-0087008 | 7/2017 |
| KR | 10-2018-0029590 | 3/2018 |
| KR | 10-2018-0036903 | 4/2018 |
| KR | 10-2018-0052059 | 5/2018 |
| KR | 10-2018-0098504 | 9/2018 |

* cited by examiner

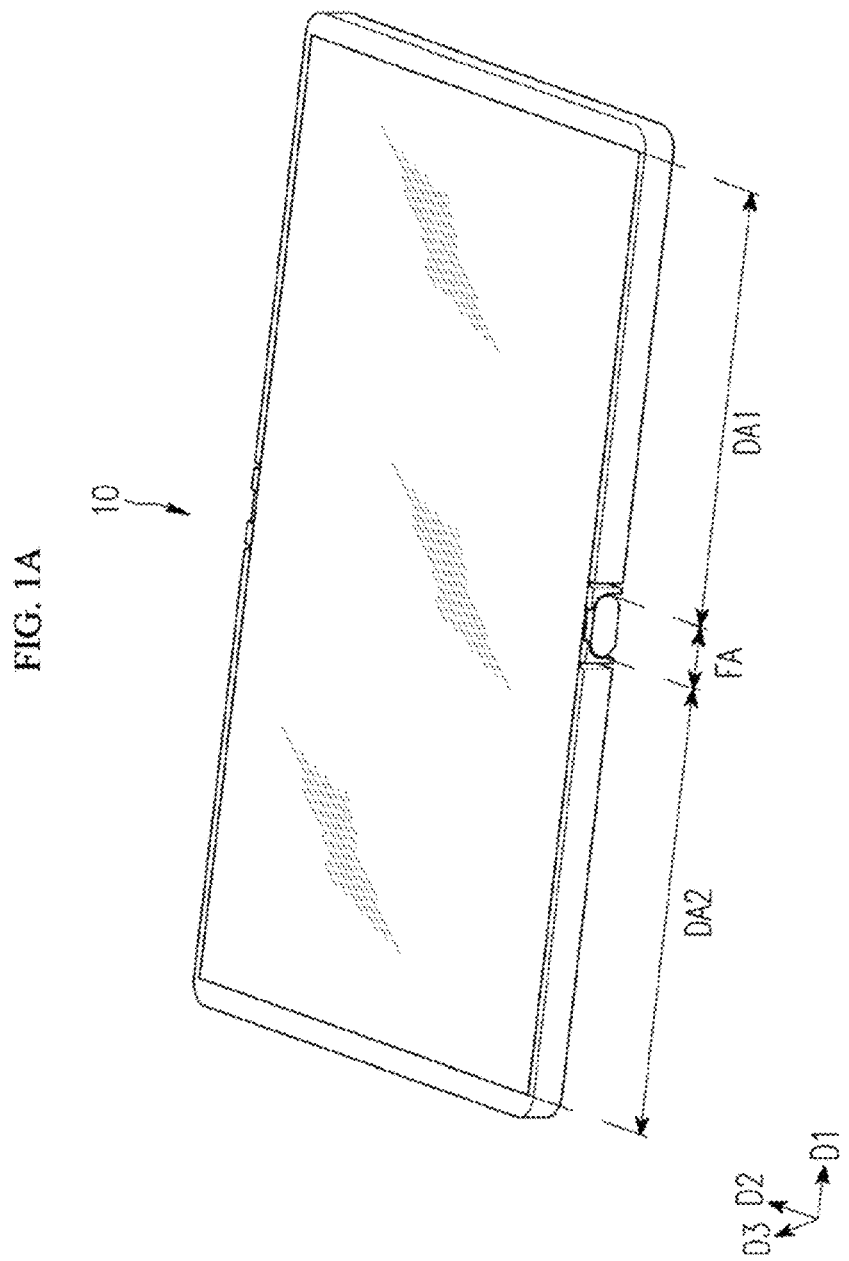

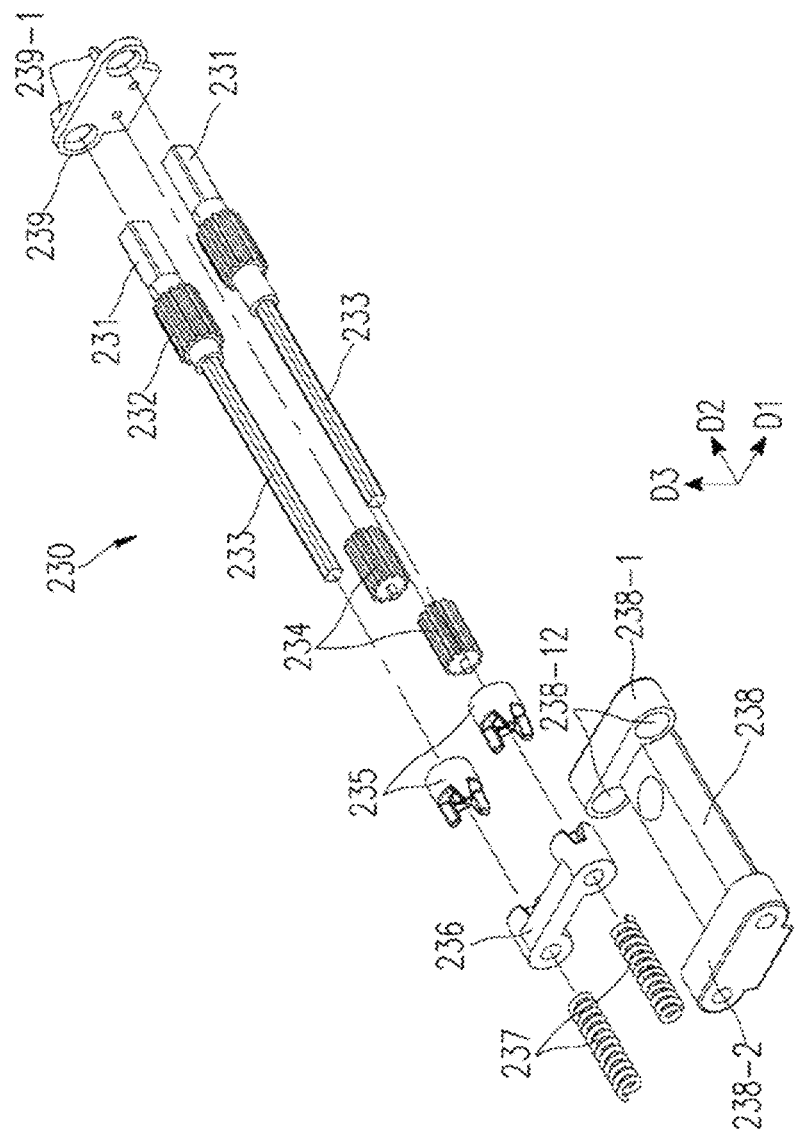

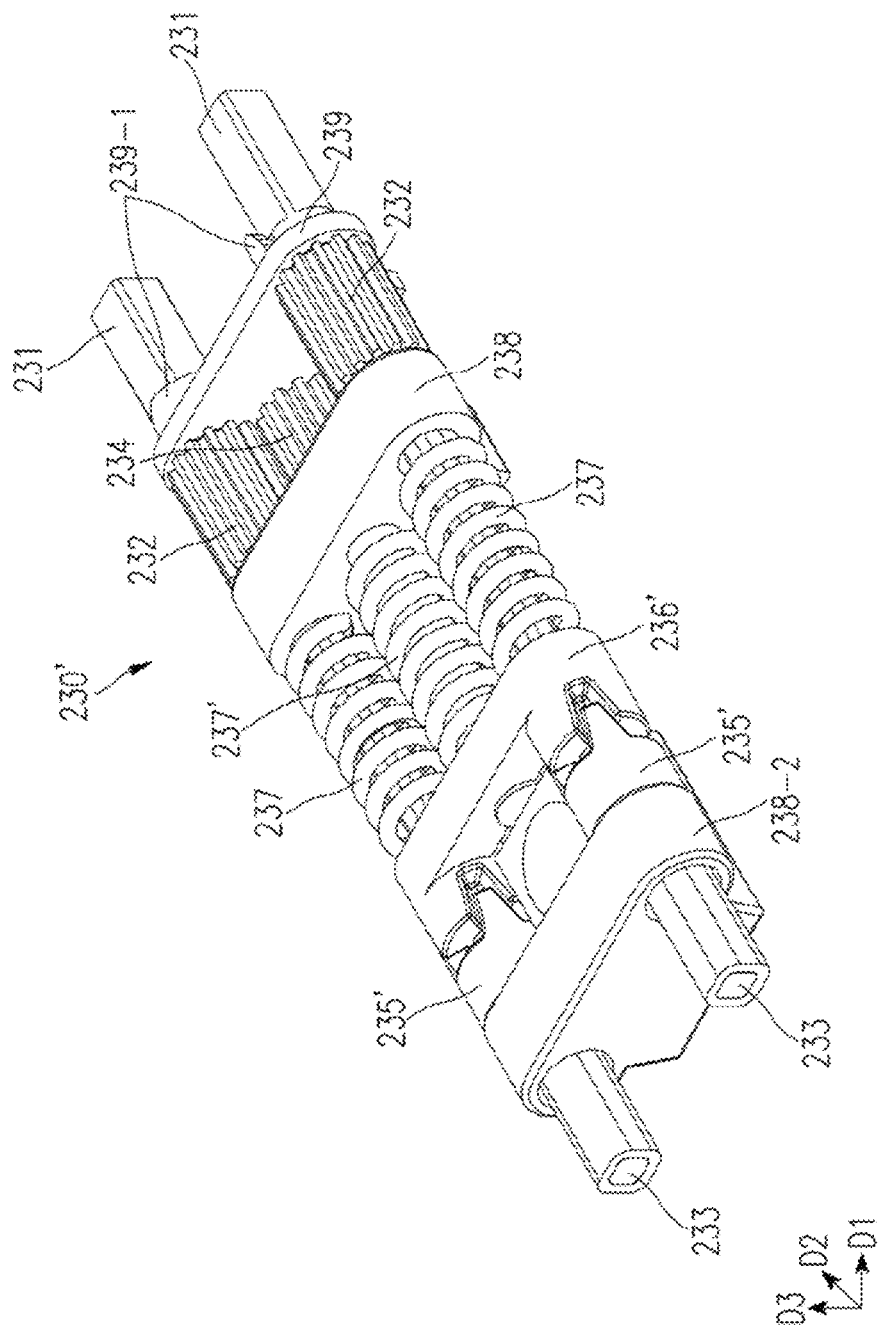

FOLDABLE DISPLAY DEVICE

CROSS-REFERENCE TO RELATED APPLICATION

This application claims priority under 35 U.S.C. § 119 to Korean Patent Application No. 10-2019-0060773, filed on May 23, 2019 in the Korean Intellectual Property Office, the disclosure of which is incorporated by reference in its entirety herein.

1. TECHNICAL FIELD

Embodiments of the present invention relates to a display device, and more particularly to a flexible display device including a hinge.

2. DISCUSSION OF RELATED ART

In recent years, flexible display devices have been developed that include flexible materials, such as plastics. Flexible display devices are capable of bending, rolling, or folding without hindering the functions of the display device. Flexible display devices include flexible OLED devices, flexible LCD devices, flexible E-paper devices, etc.

Flexible OLED devices have an advantage of being able to provide a completely flexible display device because they do not require an auxiliary light source, such as a backlight. However, flexible OLED devices are sensitive to environmental contaminants, such as moisture and oxygen, and have a complicated manufacturing and driving method. Flexible LCD devices have advantages in that they are less influenced by external environmental contaminants, such as moisture, and have a relatively less complex manufacturing and driving method. However, flexible LCD devices have disadvantages, such as the requirement of an auxiliary light source. Therefore, flexible LCD devices are difficult to realize a completely flexible device. Flexible e-paper devices have an advantage of being able to provide a completely flexible function. Additionally, flexible e-paper devices are not sensitive to moisture or oxygen and have a relatively low power consumption. However, flexible e-paper devices have a disadvantage in that it is difficult not only to implement color but also to replay a video due to a slow response speed.

A foldable display device which can be folded or unfolded in one direction has been developed. The foldable display device may include a display panel module having an appearance that is deformed during the folding and unfolding of the device.

The above information disclosed in this section is only for enhancement of understanding of the related art of the invention.

SUMMARY

Exemplary embodiments of the present invention has been made in an effort to provide a foldable display device capable of enhancing the quality of an appearance of a display panel module thereof.

An exemplary embodiment of the present invention provides a foldable display device that includes a hinge, a support plate connected to opposite ends of the hinge and a display panel module disposed on the support plate. The hinge includes a rotation axis module having a rotation axis. A first slider is connected to the rotation axis and includes a first guide line. A second slider is connected to the support plate and includes a second guide line. A link arm includes a link arm body. The link arm body has a link arm rotation axis disposed at a first end of the link arm body and a link arm pin hole disposed at a second end of the link arm body. A link arm pin is configured to extend through the link arm pin hole, the first guide line and the second guide line.

The first slider may rotate about the rotation axis, and the link arm may rotate about the link arm rotation axis which is not aligned with the rotation axis.

The link arm body may include a portion that is bent at an end of a portion extending toward the rotation axis, and the link arm rotation axis may be protruded at the bent portion in a direction that is parallel to the rotation axis.

The first slider may include a first sidewall on which the first guide line is positioned, the first guide line may be a slit that is declined toward the rotation axis from an upper side toward a lower side of the first sidewall, the second slider may include a second sidewall on which the second guide line is positioned, and the second guide line may be a slit that is inclined in a direction toward the rotation axis from an upper side toward a lower side of the first sidewall.

The rotation axis module may include: a shaft and gear configured to include a connection shaft and a shaft constituting the rotation axis, and a main gear disposed between the connection shaft and the shaft; a rotary cam coupled to the shaft; and a fixed cam engaged with the rotary cam.

The rotation axis module may further include a spring configured to support the fixed cam to provide connection between the rotary cam and the fixed cam.

The shaft and gear constituting the rotation axis may form a pair, and the pair of shafts and gears may constitute two rotation axes.

The rotation axis module may include two pinion gears disposed between the pair of shafts and gears to allow the pair of shafts and gears to rotate together.

The first slider may further include a rotation axis connector protruding toward the rotation axis to be connected to the connection axis.

The rotation axis module may further include a gear cover having a through hole that extends through the connection shaft and including a stopper that protrudes from some edges of the through hole in a direction of the rotation axis, and the rotation axis connector may be engaged with the stopper when the first slider is in an unfolded state.

The foldable display device may further include a foldable plate disposed between the support plate and the display panel module.

The foldable plate may include: a metal plate disposed on the support plate; and an elastic plate disposed on the metal plate.

The metal plate may include: a pattern portion configured to correspond to a portion forming a curved surface in a folded state and to include a bar-shaped pattern in a direction that is parallel to the rotation axis; a first support portion configured to correspond to the support plate; and a second support portion configured to correspond to a portion between the two rotation axes of the hinge.

The elastic plate may include a thermoplastic polyurethane resin.

The foldable plate may include an adhesive layer configured to adhere the first support portion to the support plate and to adhere the second support portion to the hinge cover covering the hinge.

The hinge may rotate the support plates at opposite ends thereof to allow display surfaces of the display panel module to face outward.

An exemplary embodiment of the present invention provides a foldable display device that includes a first slider having a first sidewall and a first guide line formed on the first sidewall. The first slider is configured to rotate about a rotation axis. A second slider having a second sidewall and a second guide line is formed on the second sidewall. The second slider is configured to slide together with the first slider. A link arm pin is configured to extend through the first guide line and the second guide line. A link arm is configured to be connected at a first end to the link arm pin and to rotate about a link arm rotation axis positioned at a second end. The link arm axis is spaced apart from the rotation axis.

The first guide line and the second guide line may be slits that are inclined in different directions.

When the first slider rotates about the rotation axis, the link arm pin may move along the first guide line and the second guide line and the second slider may slide on the first slider.

The foldable display device may further include: a support plate connected with the second slider; a foldable plate disposed on the support plate; and a display panel module disposed on the foldable plate, and the foldable plate may include a pattern corresponding to a portion forming a curved surface in a folded state and parallel to the rotational axis.

The rotation and movement of the hinge of the foldable display device may be interlocked, and the deformation of an appearance of the display panel module during folding and unfolding of the foldable display device may be reduced.

An exemplary embodiment of the present invention provides a hinge for a foldable display device including a rotation axis module having a rotation axis. A first slider is connected to the rotation axis. The first slider includes a first guide line. A second slider includes a second guide line. A link arm includes a link arm body having a link arm rotation axis disposed at a first end of the link arm body and a link arm pin hole disposed at a second end of the link arm body. A link arm pin is configured to extend through the link arm pin hole, the first guide line and the second guide line. The link arm rotation axis is spaced apart from the rotation axis. When the first slider rotates about the rotation axis, the link arm pin is configured to move along the first guide line and the second guide line and the second slider slides on the first slider.

BRIEF DESCRIPTION OF THE DRAWINGS

FIG. 1A illustrates a perspective view of a foldable display device in an unfolded state according to an exemplary embodiment of the present inventive concepts.

FIG. 6 illustrates an exploded perspective view of a rotation axis module according to an exemplary embodiment of the present inventive concepts.

FIG. 9A illustrates a perspective view of a rotation axis module according to another exemplary embodiment of the present inventive concepts.

DETAILED DESCRIPTION OF THE EXEMPLARY EMBODIMENTS

Embodiments of the present inventive concepts will be described more fully hereinafter with reference to the accompanying drawings, in which exemplary embodiments of the invention are shown. As those skilled in the art would realize, the described exemplary embodiments may be modified in various different ways, all without departing from the spirit or scope of the present invention.

To clearly describe the present inventive concepts, parts that are irrelevant to the description are omitted, and like numerals refer to like or similar constituent elements throughout the specification.

In addition, unless explicitly described to the contrary, the word "comprise" and variations such as "comprises" or "comprising" will be understood to imply the inclusion of stated elements but not the exclusion of any other elements.

Figure 1B:
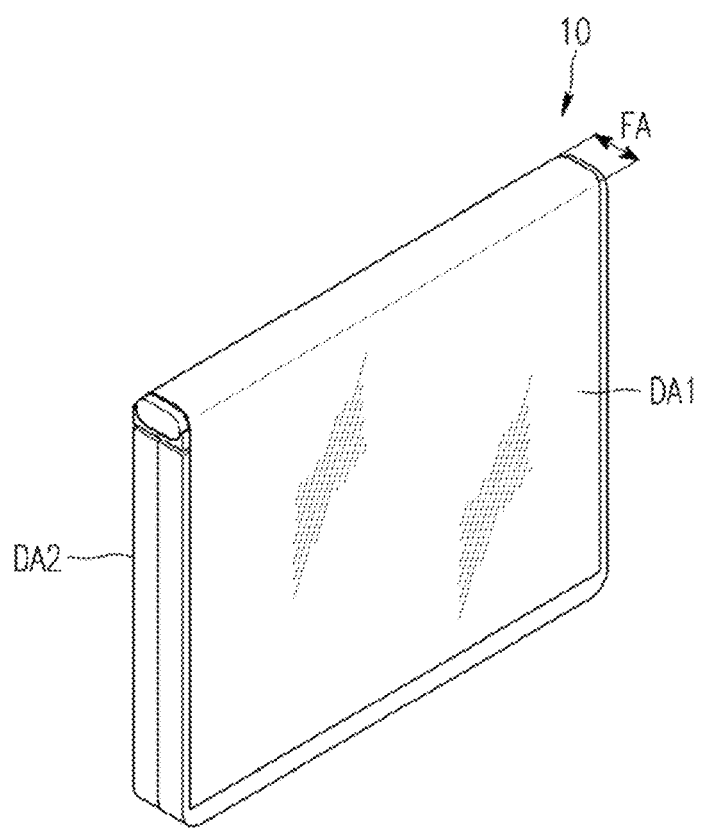
FIG. 1B illustrates a perspective view of a foldable display device that is in a folded state according to an exemplary embodiment of the present inventive concepts.

FIG. 1A illustrates a perspective view of a foldable display device according to an exemplary embodiment of the present invention, and FIG. 1B illustrates a perspective view of a foldable display device that is folded according to an exemplary embodiment of the present invention.

Referring to the exemplary embodiments shown in FIG. 1A and FIG. 1B, the display device 10 includes a first display area DA1, a second display area DA2, and a folded area FA.

The folded area FA is disposed between the first display area DA1 and the second display area DA2 (e.g., in the first direction D1). The folded area FA is an area where the foldable display device 10 is folded. The folded area FA may include at least one rotation axis for folding the display device 10.

The first display area DA1 and the second display area DA2 are areas where an image is displayed. An image is also displayed in the folded area FA. One image may be displayed on the first display area DA1, the second display area DA2, and the folded area FA. Alternatively, separate images may optionally be displayed in the first display area DA1, the second display area DA2, and/or the folded area FA.

As illustrated in FIG. 1B, the foldable display device 10 may be folded by rotating the first display area DA1 and the second display area DA2 with respect to the folded area FA. The foldable display device 10 may be outwardly folded and a display surface of the first display area DA1 and a display surface of the second display area DA2 may face outward in the folded state of the foldable display device 10. For example, Hereinafter, a first direction D1 indicates a direction perpendicular to the rotation axis of the foldable display device 10. For example, the first direction D1 may extend along the longitudinal direction of the display surface, such as the relatively longer side of a rectangular foldable display device 10. A second direction D2 indicates a direction parallel to the rotation axis of the foldable display device 10 (referred to as a rotation axis direction) and may extend along the relatively shorter side of a rectangular foldable display device 10. A third direction D3 indicates a thickness direction of the foldable display device 10. The display surface of the foldable display device 10 may be defined by the first direction D1 and the second direction D2.

Figure 2:
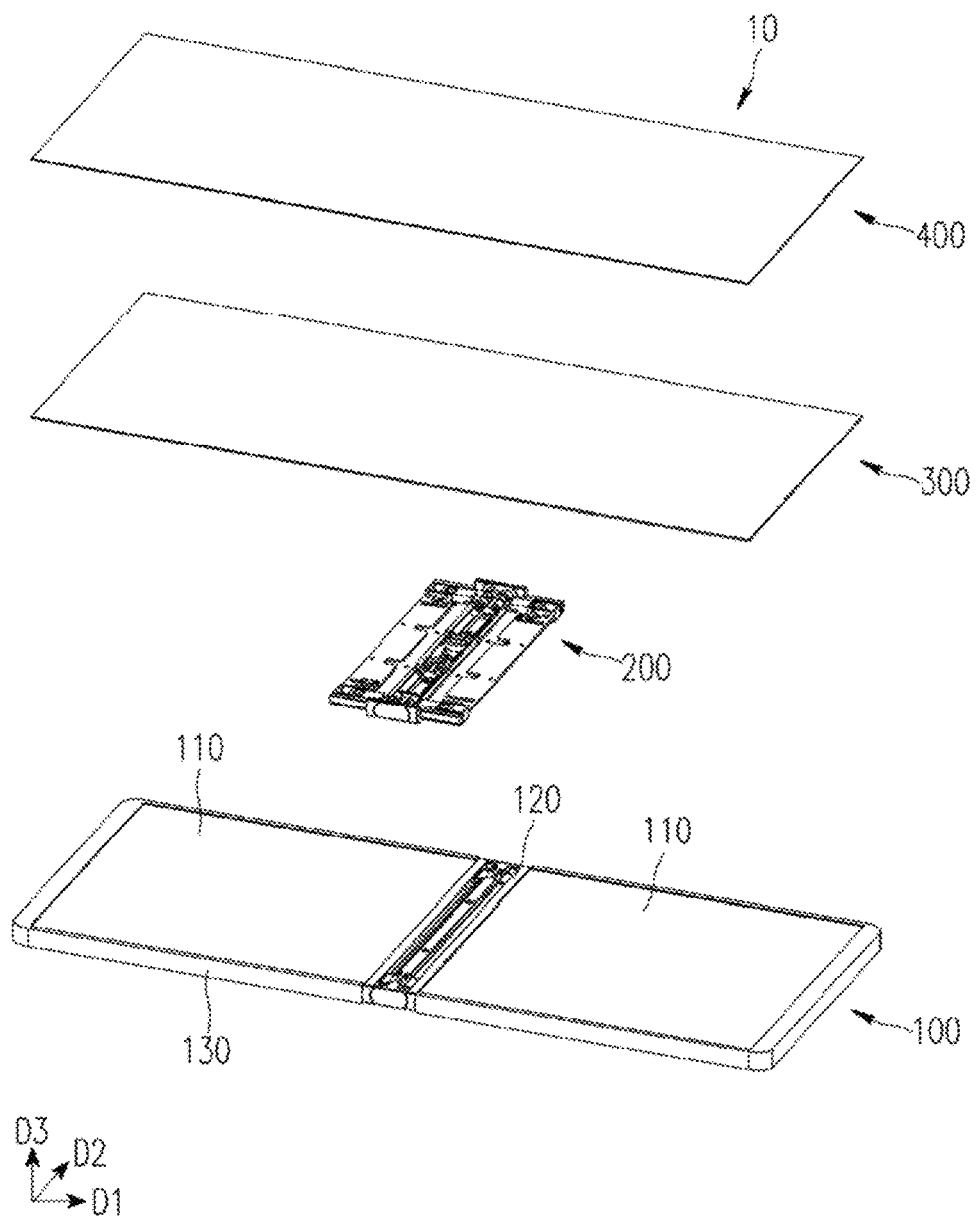
FIG. 2 illustrates an exploded perspective view of a foldable display device according to an exemplary embodiment of the present inventive concepts.

FIG. 2 illustrates an exploded perspective view of a foldable display device according to an exemplary embodiment of the present inventive concepts.

Referring to FIG. 2, the foldable display device 10 may include a support housing 100, a hinge 200, a foldable plate 300, and a display panel module 400.

The support housing 100 includes a support plate 110, a hinge cover 120, and a housing 130. The hinge cover 120 is disposed at a center of the housing 130, and the support plate 110 is disposed at opposite sides of the hinge cover 120.

The hinge 200 may be configured to rotate the opposite ends of the support plate 110 about two rotational axes that are parallel to the second direction D2 and are spaced apart in the first direction D1. A specific configuration of the hinge 200 will be described later. Portions of the hinge 200 extend inside the housing 130, and the hinge cover 120 covers portions of the hinge 200. The opposite ends of the hinge 200 (e.g., in the first direction D) may be connected to the support plates 110 on opposite sides of the hinge cover 120, respectively.

The foldable plate 300 may be affixed (e.g., adhered) to the support housing 100. In an exemplary embodiment, the foldable plate 300 may be affixed to the support plate 110 and the hinge cover 120. For example, a bottom surface of the foldable plate 300 (e.g., in the third direction D3) may directly contact a top surface (e.g., in the third direction D3) of the support housing 100 and hinge cover 120. The foldable plate 300 may form a flat surface by covering a step generated when the foldable display device 10 is unfolded. In an exemplary embodiment, the foldable plate 300 may include a metal layer and an elastic layer.

The display panel module 400 is affixed (e.g., adhered) to the foldable plate 300. For example, a bottom surface of the display panel module 400 (e.g., in the third direction D3) may directly contact a top surface (e.g., in the third direction D3) of the foldable plate 300. The display panel module 400 may include a flexible display panel and various functional members. For example, in an exemplary embodiment, the functional members may include a touch panel, an optical member, a protective member, and the like.

Hereinafter, the hinge 200 will be described in more detail with reference to FIG. 3 to FIG. 5B.

Figure 3:
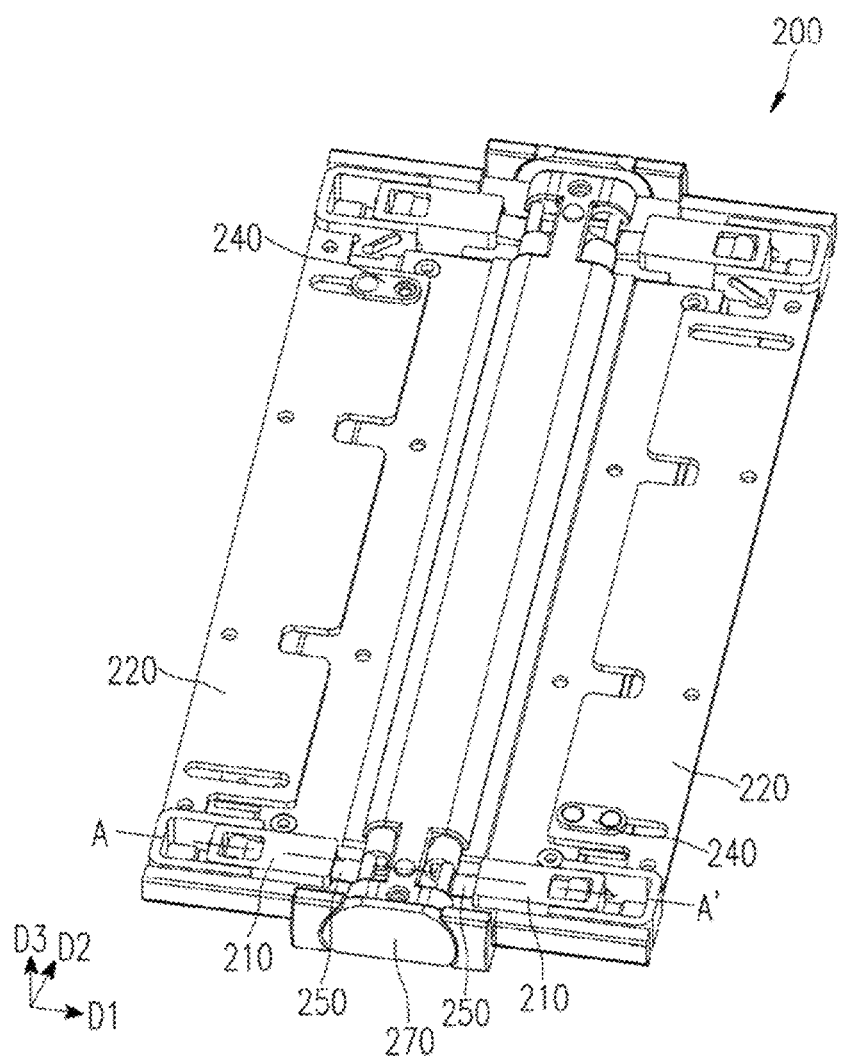
FIG. 3 illustrates a perspective view of a hinge according to an exemplary embodiment of the present inventive concepts.
Figure 4:
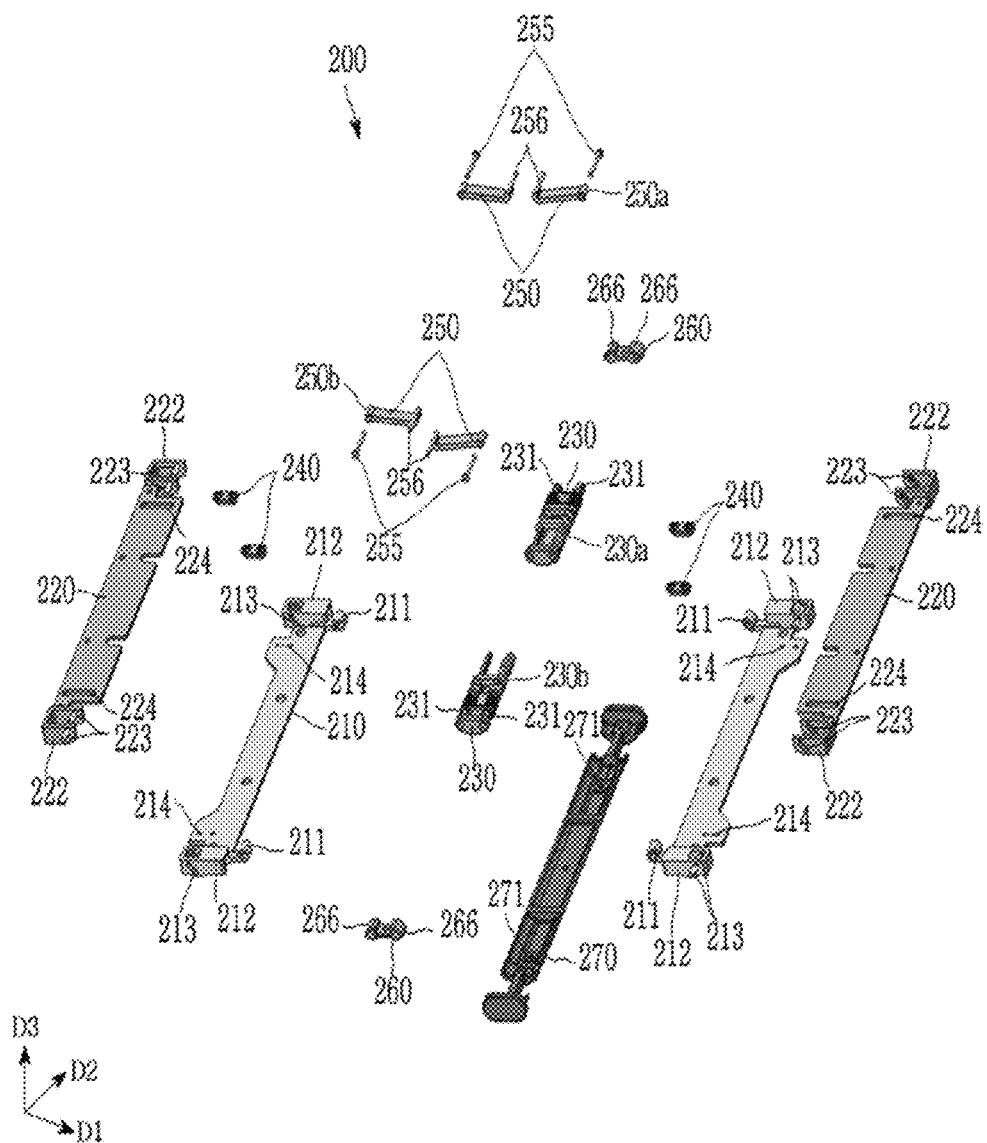
FIG. 4 illustrates an exploded perspective view of a hinge according to an exemplary embodiment of the present inventive concepts.
Figure 5A:
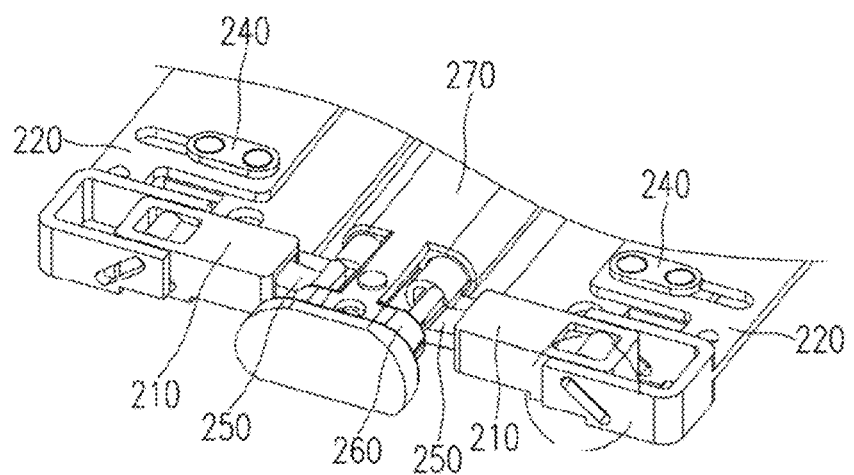
FIG. 5A illustrates a perspective view showing a portion of the hinge according to an exemplary embodiment of the present inventive concepts.
Figure 5B:
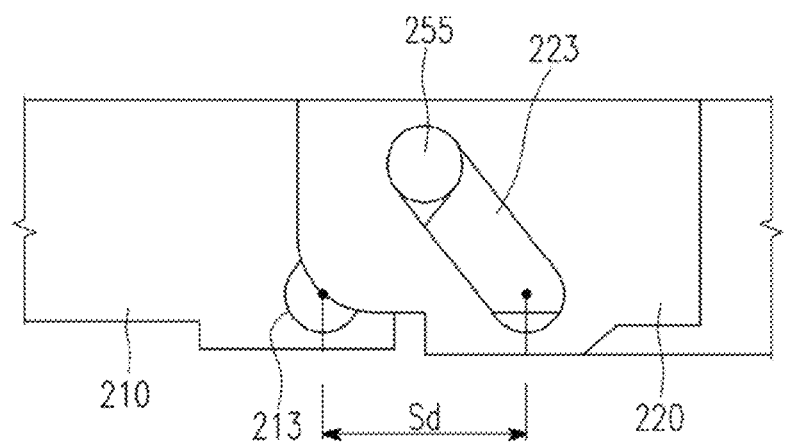
FIG. 5B illustrates a side view showing a connection state between a first slider and a second slider according to an exemplary embodiment of the present inventive concepts.

FIG. 3 illustrates a perspective view of a hinge according to an exemplary embodiment of the present invention. FIG. 4 illustrates an exploded perspective view of a hinge according to an exemplary embodiment of the present invention. FIG. 5A illustrates a perspective view showing a portion of the hinge according to an exemplary embodiment of the present invention, and FIG. 5B illustrates a side view showing a connection state between a first slider and a second slider according to an exemplary embodiment of the present invention. FIG. 5B illustrates a side view of a portion indicated by a dotted line mark in FIG. 5A.

The hinge 200 includes a first slider 210, a second slider 220, a rotation axis module 230, a slider holder 240, a link arm 250, a link arm holder 260, and a rotation axis cover 270.

The first slider 210 is disposed at both left and right sides (e.g., in the first direction D1) of the rotation axis module 230. The first slider 210 has a first body that extends longitudinally generally in a direction of the rotation axis (e.g., in the second direction D2). Hereinafter, opposite sides of the first body of the first slider 210 indicate opposite sides in the direction of the rotation axis. The first slider 210 includes a rotation axis connector 211, a first sidewall 212, a first guideline 213, and a first slider holder connector 214. The rotation axis connector 211 is formed to protrude from the opposite sides (e.g., in the second direction D2) of the first body toward the rotation axis (e.g., in the first direction D1) and be connected to the rotation axis module 230. The first sidewall 212 is disposed at opposite sides of the first body and protrudes from the first body in the third direction D3. For example, the first sidewall 212 may be disposed at lateral edges of the first body in the second direction D2 and protrudes upwardly in the third direction D3. The first sidewall 212 may include a surface that is parallel to the first direction D1 and the third direction D3. For example, in the exemplary embodiment of FIG. 4, the first sidewall 212 includes a relatively planar top surface (e.g., in the third direction D3) that extends in the first direction D1 and the second direction D2. The first sidewall 212 may be a double wall structure connected to a bottom surface or an upper side surface of the first slider 210. The first guide line 213 is disposed at the first sidewall 212. For example, in the exemplary embodiment shown in FIG. 4, the first guide line 213 may be a slit that extends through the first sidewall 212. The first guide line 213 may be declined toward the rotation axis from an upper side to a lower side of the first sidewall 212. The first guide line 213 may be formed in each of double walls of the first sidewall 212 in a same shape when the first sidewall 212 is viewed in the direction of the rotation axis (e.g., the second direction D2). The first slider holder connector 214 includes a hole or an opening through which the slider holder 240 may be inserted. In an exemplary embodiment, the first slider 210 may include a plurality of first slider holder connectors 214.

A second slider 220 is disposed at both left and right sides (e.g., in the first direction D1) of the rotation axis module 230. In an exemplary embodiment, the support plate 110 may be connected to the second slider 220 and the support plate may move depending on an operation of the second slider 220. The second slider 220 has a second body that extends longitudinally generally in the direction of the rotational axis (e.g., in the second direction D2) and is configured to slide with the first slider 210. The second slider 220 includes a second sidewall 222, a second guide line 223, and a second slider holder connector 224. The second sidewall 222 is disposed at opposite sides of the second body to protrude from the second body in the third direction D3. For example, the second sidewall 222 may be disposed at lateral edges of the second body in the second direction D2 and protrudes upwardly in the third direction D3. The second sidewall 222 may include a surface that is parallel to the first direction D1 and the third direction D3. The second sidewall 222 may be a double wall structure connected by another surface, such as a back wall, that is parallel to the second direction D2 and the third direction D3. The second sidewall 222 may be coupled with the first sidewall 212 while being overlapped therewith. For example, the double walls of the second sidewall 222 may be configured to receive the double walls of the first sidewall 212 therebetween. The second guide line 223 may be a slit that extends through the second sidewall 222. As shown in the exemplary embodiment of FIG. 4, the second guide line 223 may be formed to be inclined in a direction that is towards the rotation axis from a lower side (e.g., in the third direction D3) to an upper side (e.g., in the third direction) of the second sidewall 222. The second guide line 223 may be formed in each of double walls of the second sidewall 222 in a same shape when the second sidewall 222 is viewed in the direction of the rotation axis (e.g., in the second direction D2). Although the first guide line 213 and the second guide line 223 are illustrated as linear slits in the exemplary embodiment shown in FIG. 4, in other exemplary embodiments at least one of the first guide line 213 and the second guide line 223 may be a curved slit or may have a variety of different shapes and dimensions. The second slider holder connector 224 has at least one slit into which the slider holder 240 connected to the first slider may be inserted. For example, the second slider holder connector 224 may be a pair of slits that are spaced apart on the second slider holder connector 224 in the second direction D2 and may be adjacent to the second sidewalls 222. The second slider holder connector 224 may extend in the first direction D1 from the second body, and may overlap the first slider holder connector 214. The second slider holder connector 224 may serve to guide the second slider 220 to slide in the first direction D1. The second slider 220 may include at least two second slider holder connectors 224 corresponding to the first slider holder connectors 214.

The rotation axis module 230 may include a first rotation axis module 230a and a second rotation axis module 230b that are seated on seating portions 271 at opposite sides (e.g., in the second direction D2) of the rotation axis cover 270. Each of the first rotation axis module 230a and second rotation axis module 230b includes two connection shafts 231 to which the first sliders 210 at left and right sides thereof are respectively connected. The two rotation axis connectors 211 of the first slider 210 at a left side are respectively connected to the connection shaft 231 at a left side of a first rotation axis module 230a and the connection shaft 231 at a left side of a second rotation axis module 230b. The two rotation axis connectors 211 of the first slider 210 at a right side are respectively connected to the connection shaft 231 at a right side of a first rotation axis module 230a and the connection shaft 231 at a right side of a second rotation axis module 230b. The first slider 210 and the second slider 220 rotate about the connection shaft 231 of the rotation axis module 230. The rotation axis module 230 interlocks the first slider 210 at the left side and the first slider 210 at the right side to perform folding and unfolding. The rotation axis module 230 may enhance a sensation of the folding motion imparted to the user as the foldable display device 10 is folded. A structure of the rotation axis module 230 will be described later.

When the second slider 220 overlaps the first slider 210 on the first slider, the slider holder 240 is coupled to the first slider holder connector 214 through the second slider holder connector 224. Accordingly, the second slider 220 may slide on the first slider 210 along the second slider holder connector 224 in the first direction D1.

The link arm holder 260 is coupled to end portions of the seating portions 271 at opposite sides (e.g., in the second direction D2) of the rotation axis cover 270. The link arm holder 260 includes two link shaft holders 266 corresponding to the two connection shafts 231 of the rotation axis module 230.

The link arm 250 includes a link arm body, a link arm pin 255, and a link arm rotation axis 256. The link arm body includes a portion extending toward the rotation axis, a hole portion which is configured to receive the link arm pin 255 at a first end (e.g., an end farthest from the link arm rotation axis 256) of the extended portion, and a portion bent in a direction of about 90 degrees (e.g., extending in the third direction D3) from a second end (e.g., an end adjacent the link arm rotation axis) of the extended portion. The hole portion of the link arm body is positioned to overlap (e.g., in the second direction D2) the first guide line 213 of the first slider 210 and the second guide line 223 of the second slider 220. The link arm pin 255 is coupled to the hole portion of the link arm 250 and extends through the second guide line 223 and the first guide line 213. The link arm rotation axis 256 protrudes in the second direction D2 from the bent portion of the link arm body to be inserted into the link arm holder 260 attached to the seating portions 271 of the rotational axis cover 270. The link arm 250 rotates about the link arm rotation axis 256. Two link arms 250a, 250b may be coupled to the first and second sliders 210 and 220 at the left side, and another two link arms may be coupled to the first and second sliders 210 and 220 at the right side.

As illustrated in illustrated in FIG. 5B, the link arm pin 255 is fixed to the link arm 250 through the second guide line 223 and the first guide line 213. Since the link arm 250 rotates about the link arm rotation axis 256, the link arm pin 255 may move along the first guide line 213 in a diagonal downward direction and the second slider 220 may move in a direction toward the first slider 210 as the foldable display device 10 is folded. When the foldable display device 10 is unfolded, the link arm pin 255 may move along the first guide line 213 in a diagonal upward direction, and the second slider 220 may move in a direction away from the first slider 210. A sliding distance Sd of the second slider 220 is determined depending on an inclination of the first guide line 213 and the second guide line 223 in a diagonal direction.

Hereinafter, the rotation axis module 230 will be described in more detail with reference to FIG. 6 to FIG. 9C.

Figure 7A:
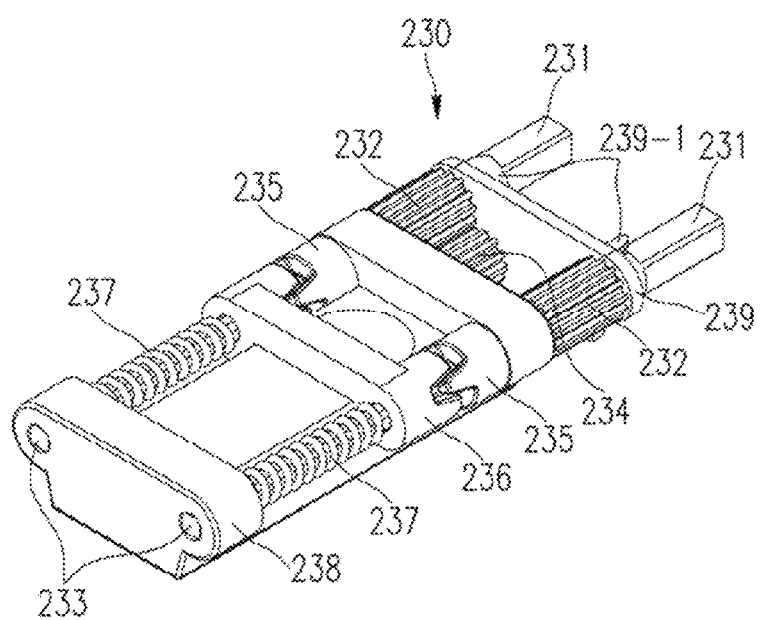
FIG. 7A illustrates a perspective view of a rotation axis module according to an exemplary embodiment of the present inventive concepts.
Figure 7B:
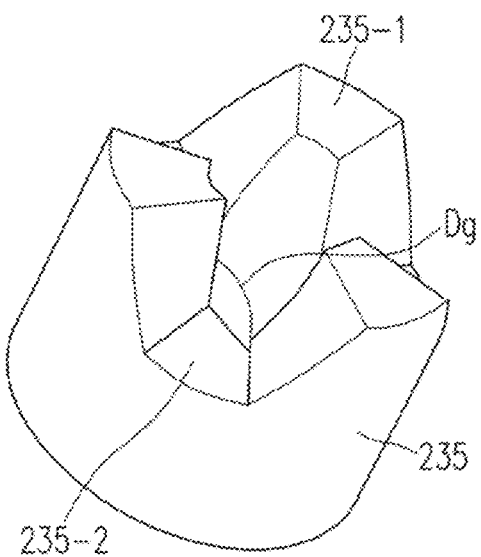
FIG. 7B illustrates a perspective view of a cam of a rotation axis module according to an exemplary embodiment of the present inventive concepts.
Figure 7C:
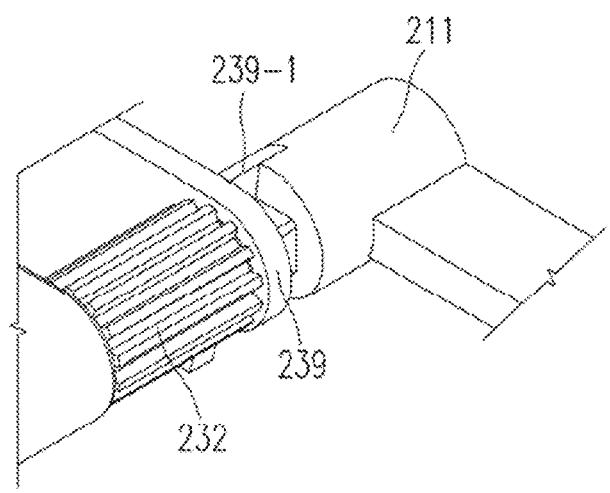
FIG. 7C illustrates a perspective view showing a connection portion between a rotation axis module and a first slider according to an exemplary embodiment of present inventive concepts.
Figure 8:
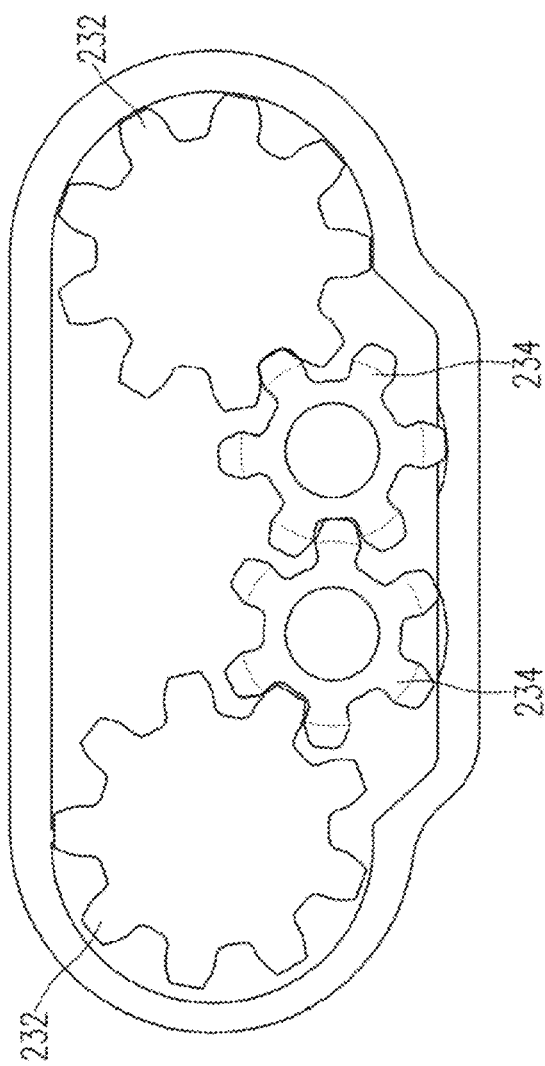
FIG. 8 illustrates a cross-sectional view showing a connection state between a main gear and a pinion gear according to an exemplary embodiment of the present inventive concepts.
Figure 9B:
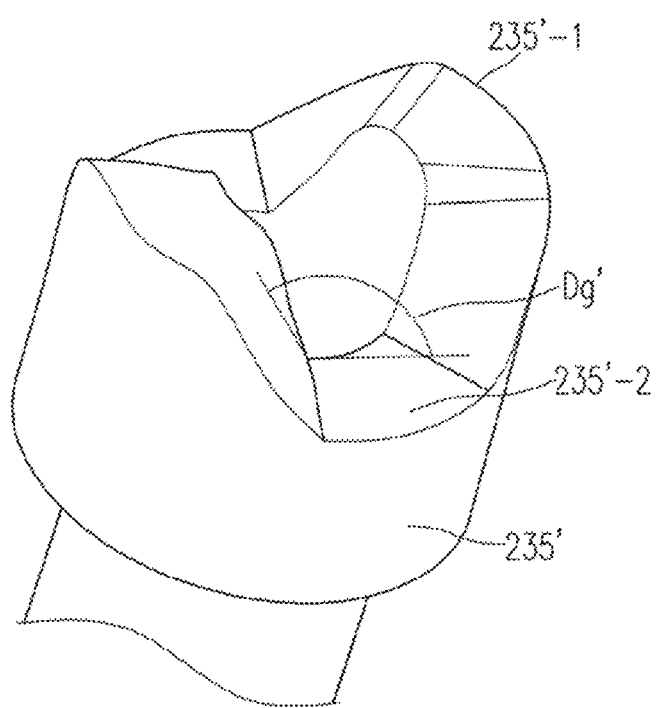
FIG. 9B illustrates a perspective view of a cam of a rotation axis module according to another exemplary embodiment of the present inventive concepts.
Figure 9C:
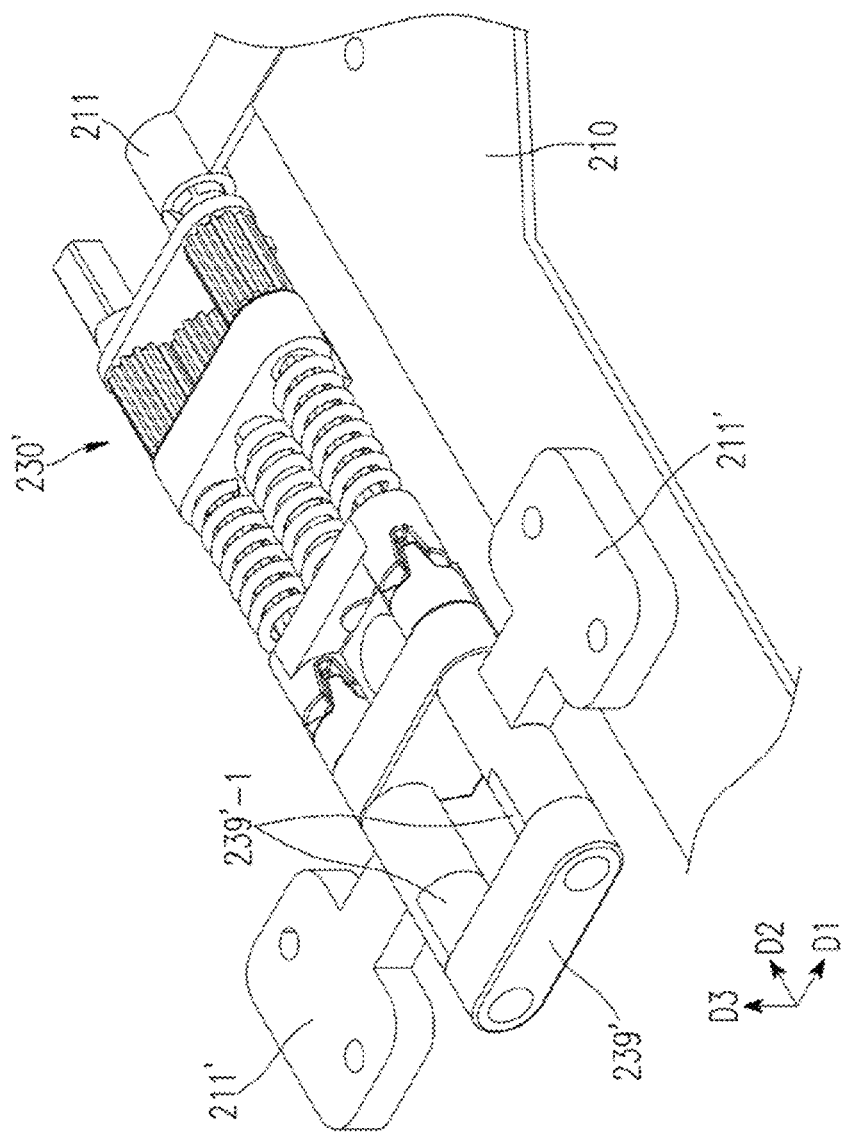
FIG. 9C illustrates a perspective view showing a connection state between a rotation axis module and a first slider according to another exemplary embodiment of present inventive concepts.
Figure 9D:
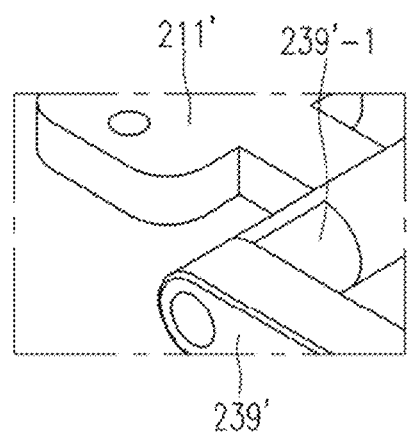
FIG. 9D illustrates a perspective view showing a connection portion between a rotation axis module and a first slider according to another exemplary embodiment of present inventive concepts.

FIG. 6 illustrates an exploded perspective view of a rotation axis module according to an exemplary embodiment of the present inventive concepts. FIG. 7A illustrates a perspective view of a rotation axis module according to an exemplary embodiment of the present inventive concepts. FIG. 7B illustrates a perspective view of a cam of a rotation axis module according to an exemplary embodiment of the present inventive concepts. FIG. 7C illustrates a perspective view showing a connection portion between a rotation axis module and a first slider according to an exemplary embodiment of present inventive concepts. FIG. 8 illustrates a cross-sectional view showing a connection state between a main gear and a pinion gear according to an exemplary embodiment of the present inventive concepts. FIG. 9A illustrates a perspective view of a rotation axis module according to another exemplary embodiment of the present inventive concepts. FIG. 9B illustrates a perspective view of a cam of a rotation axis module according to another exemplary embodiment of the present inventive concepts. FIG. 9C illustrates a perspective view showing a connection state between a rotation axis module and a first slider according to another exemplary embodiment of the present inventive concepts. FIG. 9D illustrates a perspective view showing a connection portion between a rotation axis module and a first slider according to another exemplary embodiment of present inventive concepts. FIG. 9D illustrates a display portion of FIG. 9C indicated by a dotted line.

The rotation axis module 230 includes a shaft and gear, a pinion gear 234, a cam module, a spring 237, a module housing 238, and a gear cover 239. The shaft and gear includes a connection shaft 231, a main gear 232, and a shaft 233. The connection shaft 231 and the shaft 233 form a single rotation axis. The main gear 232 is disposed between the connection shaft 231 and the shaft 233 (e.g., in the second direction D2), and the connection shaft 231 and the shaft 233 serve as a rotation axis of the main gear 232. In an exemplary embodiment, the rotation axis module 230 includes a pair of shafts and gears (e.g., arranged in the first direction D1), and the pair of shafts and gears serve as two rotation axes of the foldable display device 10 (e.g., a left rotation axis and a right rotation axis in the first direction D1).

As illustrated in FIG. 8, two pinion gears 234 are engaged between two main gears 232 so that the two main gears 232 rotate together. The two main gears 232 that are connected by the two pinion gears 234 rotate in opposite directions.

The cam module includes two rotary cams 235 and one fixed cam 236. The rotary cams 235 are spaced apart in the first direction D1 and include an engagement hole to be engaged with the shaft 233, and are configured to rotate together with the shaft 233. The fixed cam 236 includes two cam portions arranged in the first direction D1 that engage the two rotary cams 235. The fixed cam 236 may include two through-holes for penetrating the two shafts 233 without engaging the shaft.

As illustrated in FIG. 7B, the rotary cams 235 or the fixed cam 236 may include a plurality of protrusions 235-1 protruding from an edge thereof in a direction of the rotation axis (e.g., in the second direction D2) about the rotation axis, and a plurality of recesses 235-2 between the protrusions 235-1. For example, as shown in FIG. 7B, the rotary cams 235 or the fixed cam 236 may include three protrusions 235-1 and three recesses 235-2. Each of the protrusions 235-1 is formed as a slip surface having a flat distal end, and the slip surface contacts a surface of the corresponding recess 235-2 as an inclined surface.

In an exemplary embodiment, an edge length of the slip surface of the protrusion 235-1 may be approximately 0.9 mm, and an inclination angle Dg of the inclined surface may be approximately 110 degrees. In other exemplary embodiments, the edge length of the slip surface of the protrusion 235-1 may be between 0.6 mm-1.2 mm and the inclined surface may be approximately 95-125 degrees. However, the edge length of the slip surface and a magnitude of the inclination angle Dg are not limited to these exemplary embodiments.

Two springs 237 may support the fixed cam 236. For example, in the exemplary embodiment shown in FIG. 7A, two springs 237 are configured to exert a biasing force in the second direction D2 to support the fixed cam 236. The two shafts 233 extending through the fixed cam 236 may be respectively disposed at centers of the coil-shaped springs 237. The springs 237 provide a biasing force or "connection force" against the fixed cam 236 to connect the fixed cam 236 to the rotary cams 235. However, in other exemplary embodiments, the number of springs and the configuration of the springs may be modified.

As the rotary cams 235 that receive the connection force are rotated, the rotary cams 235 and the fixed cam 236 are subjected to normal engagement and open engagement. Therefore, the rotary cams 235 and fixed cam 236 help impart a sensation of the folding motion of the foldable display device 10 to the user during a folding operation of the foldable display device 10. As illustrated in FIG. 7A, the normal engagement of the cam module indicates a state in which the rotary cams 235 are engaged with the fixed cam 236 by allowing the protrusions 235-1 to be inserted into the recesses 235-2 of the counterpart. The open engagement of the cam module indicates a state in which the protrusions 235-1 of the rotary cams 235 and the fixed cam 236 face each other such that a space is formed between the recesses 235-2. For example, in an exemplary embodiment, the cam module may be in a normal engagement state when the foldable display device 10 is in a fully folded state, and may be in an open engagement state when it is in a middle state between the fully folded state and the unfolded state.

The module housing 238 includes a body portion, a first support wall 238-1, and a second support wall 238-2 spaced apart in the second direction D2. The first support wall 238-1 protrudes from a first side of the body portion in the third direction D3. The first support wall 238-1 includes two through holes 238-12 through which the two shafts 233 extend. The second support wall 238-2 protrudes from a second side of the body portion in the third direction D3 to face the first support wall 238-1. The two rotation cams 235, the fixed cam 236, and the two springs 237 are disposed between the first support wall 238-1 and the second support wall 238-2. The shaft 233 may extend through the through hole 238-12 of the module housing 238, the engagement hole of the rotary cam 235, the through hole of the fixed cam 236, and the center of the spring 237 to be supported by the second support wall 238-2.

A gear cover 239 includes a body portion and a stopper 239-1. The body portion may have a surface shape that extends in the first direction D1 and the third direction D3. The body portion of the gear cover 239 may include two through holes that penetrate the two connection shafts 231. The stopper 239-1 may include two stoppers 239-1, which protrude in the second direction D2 from edges of each of the two through holes of the body portion.

As illustrated in FIG. 7C, the rotation axis connectors 211 of the first slider 210 are connected to the connection shafts 231. The rotation axis connector 211 has a groove shape which engages with the stopper 239-1 when the first slider 210 is in an unfolded state. When rotating from a folded state to the unfolded state, stopper 239-1 is configured to prevent the first slider 210 from rotating beyond the unfolded state.

As illustrated in FIG. 9A to FIG. 9D, a rotation axis module 230' according to another exemplary embodiment may further include a third spring 237' to increase the connection force of the cam module. The shaft 233 may extend further through the second support wall 238-2 of the module housing 238. The positions of the cam module and the springs 237 and 237' may be opposite to those of the cam module and the spring of FIG. 7A. The cam module includes a rotary cam 235' and a fixed cam 236'. Positions of the rotary cam 235' and the fixed cam 236' may also be opposite to those of the rotary cam 235 and the fixed cam 236 of FIG. 7A. For example, the springs may be positioned adjacent the main gear 232 and the pinion gears 234 in the second direction D2 and the rotary cams 235' may be adjacent the second support wall 238-2.

As illustrated in FIG. 9B, one of the rotation cam 235' and the fixed cam 236' has two protrusions 235'-1 and recesses 235-2' between the two protrusions 235'-1. The edge length of the slip surface of each of the protrusions 235'-1 is approximately 1.2 mm, and the inclination angle Dg' of the inclined surface may be approximately 120 degrees. In other exemplary embodiments, the edge length of the slip surface of the protrusion 235'-1 may be between 0.8 mm-1.6 mm and the inclined surface may be approximately 105-135 degrees. However, the edge length of the slip surface and a magnitude of the inclination angle Dg' are not limited.

As illustrated in FIGS. 9C and 9D, an additional rotation axis connector 211' may be connected to the shaft 233 that further extends through the second support wall 238-2, and a shaft cover 239' may be connected to an end portion of the shaft 233. The additional rotation axis connector 211' connects the first body of the first slider 210 to the shaft 233. The shaft cover 239' includes a body portion and a stopper 239'-1. The body portion may have a top surface that extends in the first direction D1 and the second direction D2, and may have holes into which the two shafts 233 are inserted (e.g., in the third direction D3). The stopper 239'-1 may include two stoppers 239'-1, which protrude in the second direction D2 from edges of each of the two holes of the body portion. The additional rotation axis connector 211' has a groove shape to engage with the stopper 239-1 when the first slider 210 is in the unfolded state.

Hereinafter, the operation of the hinge 200 will be described in more detail with reference to FIG. 10 to FIG. 12.

Figure 10:
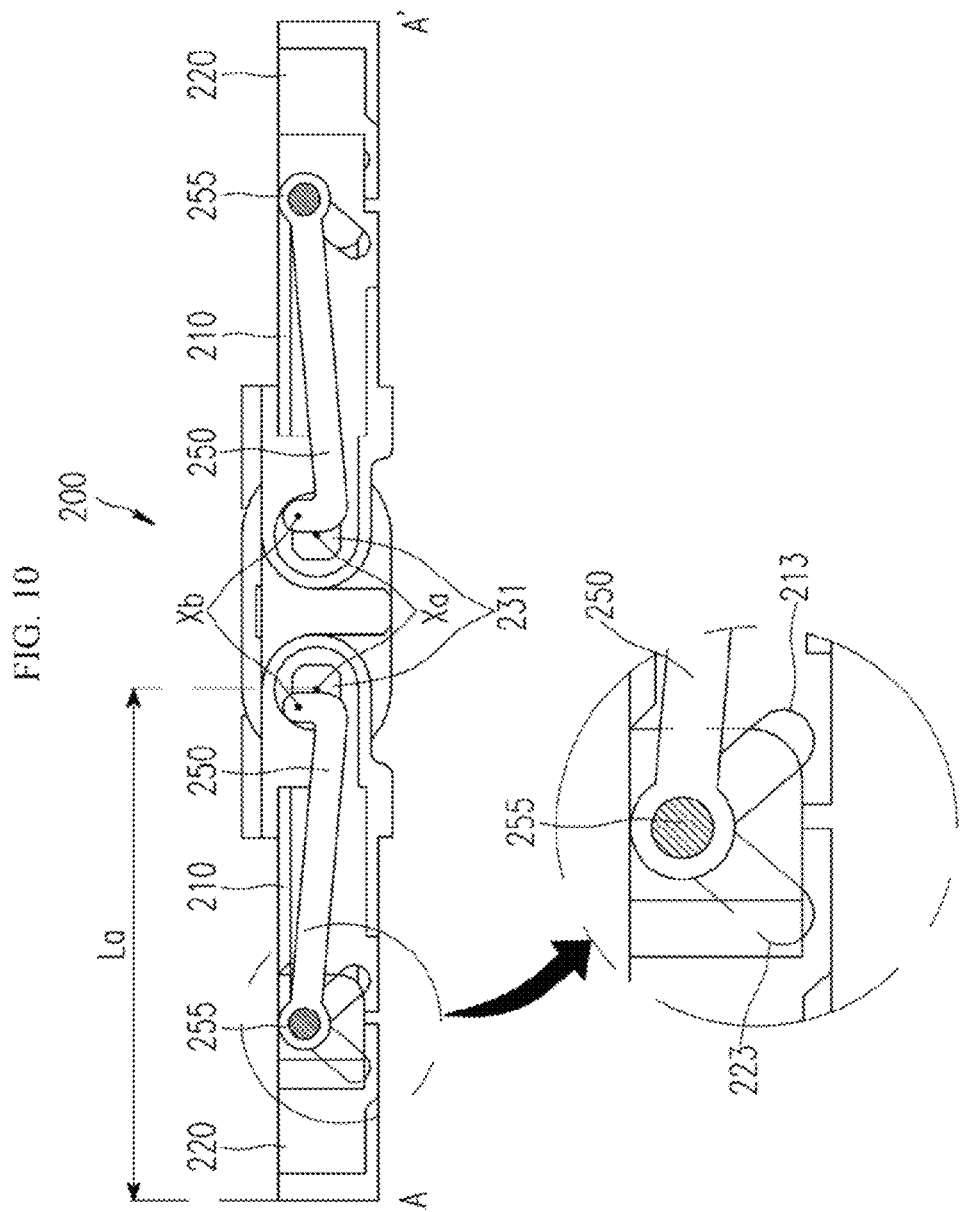
FIG. 10 illustrates a cross-sectional view taken along line A-A of FIG. 3 showing an unfolded state of a hinge according to an exemplary embodiment of the present inventive concepts.

FIG. 10 illustrates a cross-sectional view showing an unfolded state of a hinge taken along line A-A' of FIG. 3 according to an exemplary embodiment of the present inventive concepts. FIG. 11 illustrates a cross-sectional view showing a 45-degree folded state of a hinge according to an exemplary embodiment of the present inventive concepts. FIG. 12 illustrates a cross-sectional view showing a 90-degree folded state of a hinge according to an exemplary embodiment of the present inventive concepts.

Figure 11:
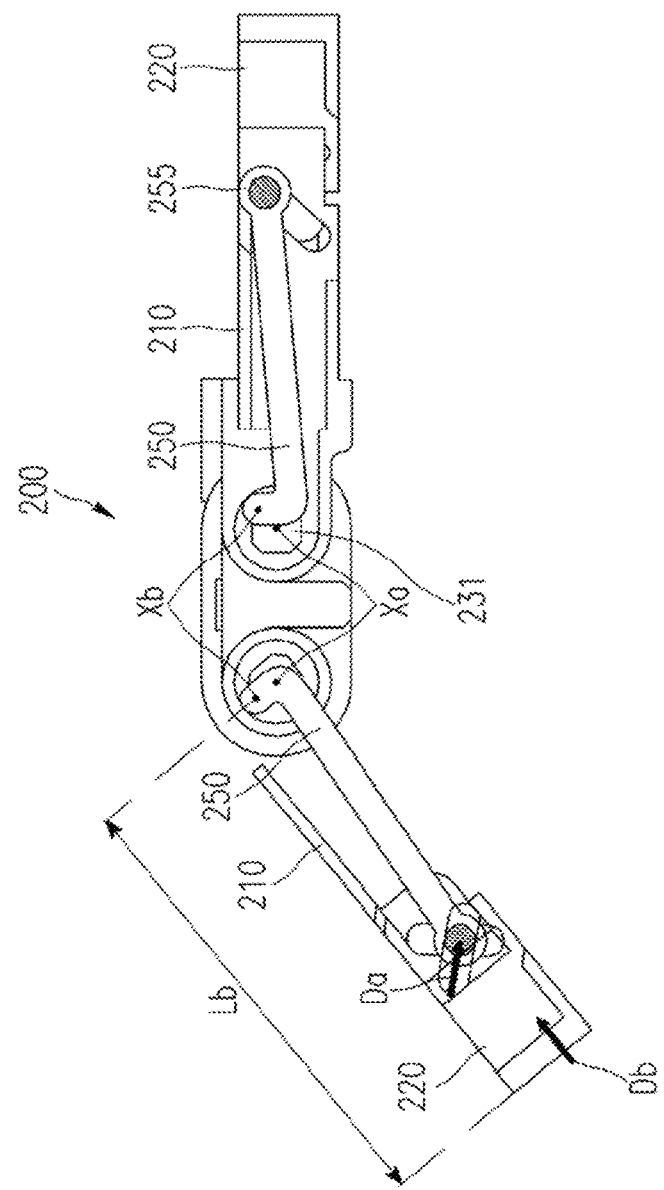
FIG. 11 illustrates a cross-sectional view showing a 45-degree folded state of a hinge according to an exemplary embodiment of the present inventive concepts.
Figure 12:
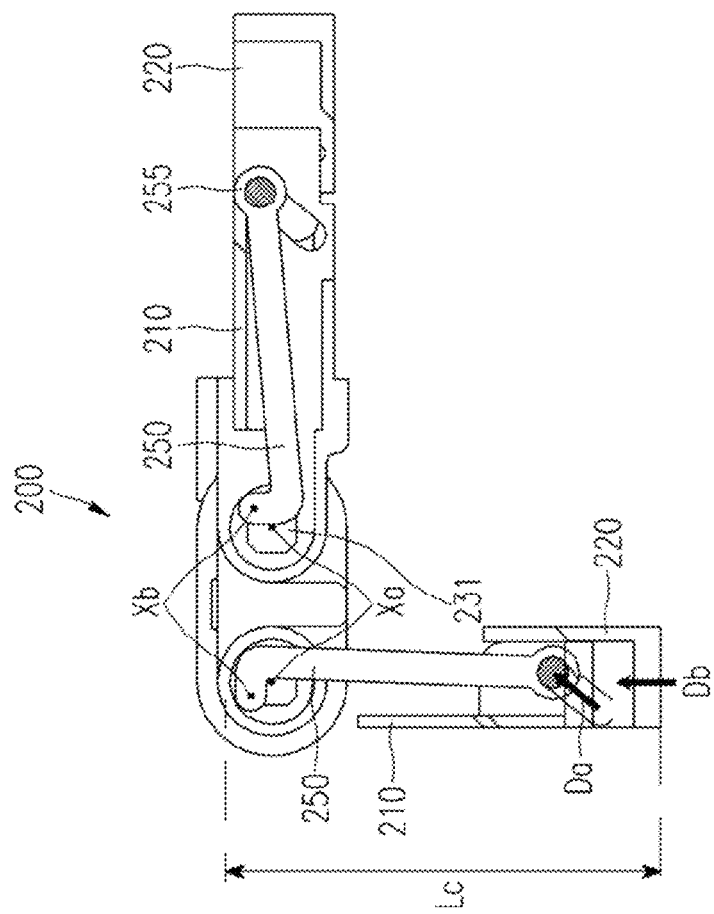
FIG. 12 illustrates a cross-sectional view showing a 90-degree folded state of a hinge according to an exemplary embodiment of the present inventive concepts.

In FIG. 10 to FIG. 12, the operation of the hinge 200 will be described by taking a cross-sectional view taken along line A-A' of FIG. 3 as an example.

As illustrated in FIG. 10, the link arm rotation axis 256 is disposed at a bent portion of the link arm 250, and rotation axes Xb of the link arm 250 are not aligned with rotation axes Xa of the sliders 210 and 220. For example, the link arm rotation axes Xb of the link arm 250 may protrude at the bent portion of the link arm away from rotation axes Xa of the sliders 210 and 220. The sliders 210 and 220 rotate about the rotation axes Xa and the link arm 250 rotates about the rotation axis Xb of the link arm 250. When the hinge 200 is in the unfolded state, the link arm pin 255 is positioned at upper ends (e.g., in the third direction D3) of the first guide line 213 and the second guide line 223.

As illustrated in FIG. 11, as the link arm 250 rotates along the rotation axis Xb of the link arm that is different from the rotation axis Xa of the sliders 210 and 220, the link arm pin 255 moves along the first guideline 213 of the first slider 210. Further, the link arm pin 255 moves along the second guide line 223 of the second slider 220. Accordingly, when the hinge 200 is in a 45-degree folding state, the link arm pin 255 is positioned at a middle portion of the first guide line 213 and at a middle portion of the second guide line 223. As a result, the second slider 220 moves in a direction toward the first slider 210.

A first distance La between the rotation axis Xa when the hinge 200 is in the unfolded state and an outermost part of the second slider 220 (e.g., the distal end of the second slider in the first direction D1 when the foldable display device 10 is in an unfolded state) is larger than a second distance Lb between the rotation axis Xa when the hinge 200 is in the 45-degree folded state and the outermost part of the second slider 220.

When one of the sliders 210 and 220 is folded by the rotation axis module 230, the other slider 210 or 220 is folded at a same angle. However, for convenience of explanation, FIG. 11 and FIG. 12 illustrate only one of the sliders 210 and 220 folded for comparison with the unfolded state. However, in exemplary embodiments in which the pinion gear 234 is omitted from the rotation axis module 230, the foldable display device 10 may permit only one of the sliders 210 and 220 to be folded.

As illustrated in FIG. 12, when the hinge is in the 90-degree folded state, the link arm pin 255 is positioned at lower ends of the first guide line 213 and the second guide line 223. The lower ends of the first guide line 213 and the second guide line 223 are in relation to the third direction D3 when the foldable device 10 is in an unfolded state. As a result, the second slider 220 maximally moves in a direction toward the first slider 210. The second distance Lb between the rotation axis Xa when the hinge 200 is in the 45-degree folded state and the outermost part of the second slider 220 is larger than a third distance Lc between the rotation axis Xa when the hinge 200 is in the 90-degree folded state and the outermost part of the second slider 220.

As such, as the rotation and movement of the sliders 210 and 220 cooperate with each other in the hinge 200, deformation of an appearance of the display panel module during folding and unfolding of the foldable display device 10 may be reduced.

Hereinafter, the foldable plate will be described in more detail with reference to FIG. 13 to FIG. 15.

Figure 13:
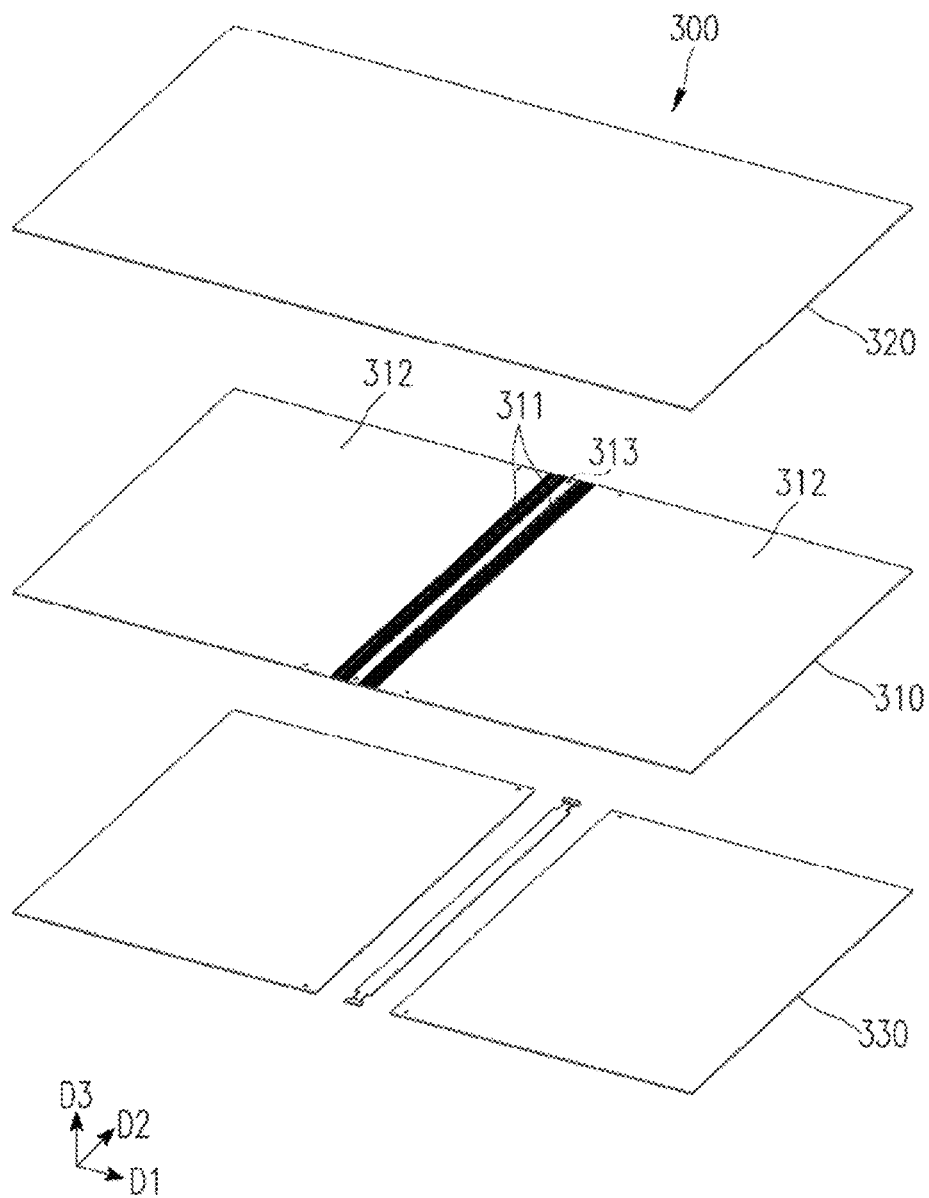
FIG. 13 illustrates an exploded perspective view of a foldable plate according to an exemplary embodiment of the present inventive concepts.

FIG. 13 illustrates an exploded perspective view of a foldable plate according to an exemplary embodiment of the present inventive concepts. FIG. 14 illustrates an exploded perspective view of a folded region of a foldable plate according to an exemplary embodiment of the present invention. FIG. 15 illustrates a cross-sectional view showing a state in which a foldable plate covers a slide gap between a support plate and a hinge cover.

The foldable plate 300 may include a metal plate 310, an elastic plate 320, and an adhesive layer 330. The elastic plate 320 is disposed on the metal plate 310. For example, in an exemplary embodiment, a bottom portion of the elastic plate 320 (e.g., in the third direction D3) may be disposed directly on atop portion of the metal plate 310. The adhesive layer 330 is disposed below the metal plate 310 (e.g., in the third direction D3). The display panel module 400 is disposed on the elastic plate 320. The display panel module 400 may be affixed (e.g., adhered) to the elastic plate 320.

The metal plate 310 includes a pattern portion 311, a first support portion 312, and a second support portion 313. The pattern portion 311 corresponds to a portion forming a curved surface when the foldable display device 10 is folded. The first support portion 312 may correspond to the support plates 110 at opposite sides of the support housing 100, and may be adhered to the support plate 110 by the adhesive layer 330. The second support portion 313 may correspond to a portion between the two rotation axes of the hinge 200, and may be adhered to the hinge cover 120 by the adhesive layer 330. One pattern portion 311 is disposed between the first support portion 312 and the second support portion 313 at the left side (e.g., in the first direction D1), and another pattern portion 311 is disposed between the first support portion 312 and the second support portion 313 at the right side (e.g., in the first direction).

Figure 14:
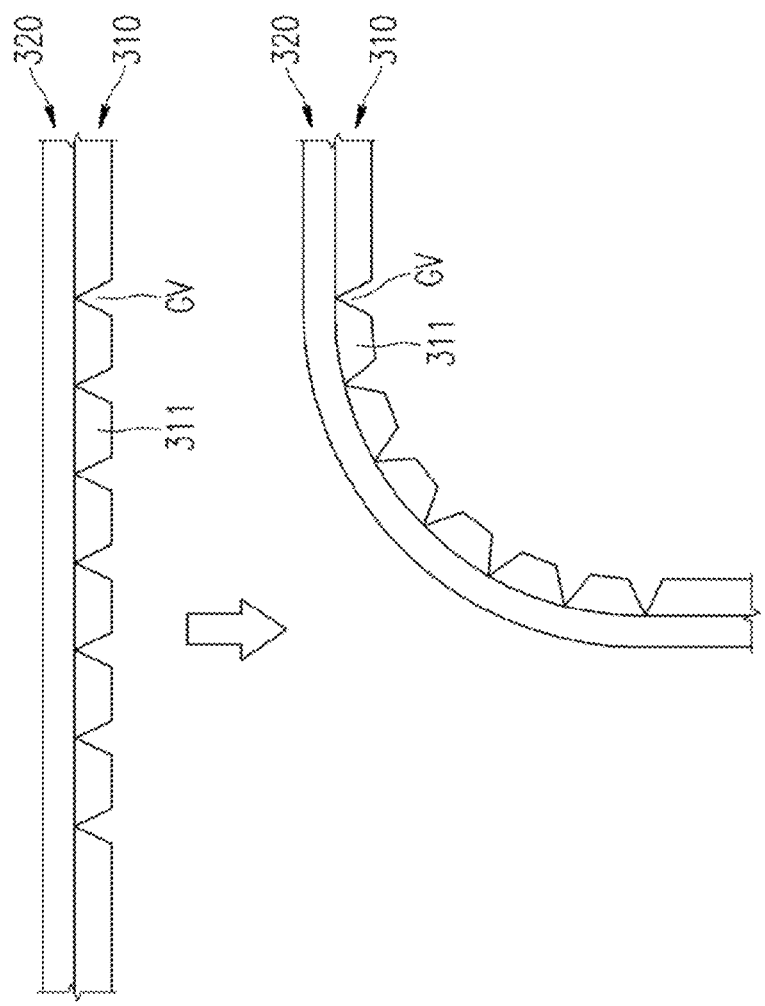
FIG. 14 illustrates an exploded perspective view of a folded region of a foldable plate according to an exemplary embodiment of the present inventive concepts.

In the exemplary embodiment shown in FIG. 14, the pattern portion 311 includes bar-shaped patterns extending in the second direction D2. However, exemplary embodiments of the present inventive concepts are not limited thereto. The bar-shaped pattern portion 311 may be formed by removing a portion of the metal plate 310 by a mechanical or chemical method at a portion corresponding to the pattern portion 311 in the metal plate 310. A plurality of grooves GV that are mechanically or chemically removed from the metal plate 310 are formed between the bar-shaped patterns. The pattern portion 311 may provide flexibility for the foldable plate 300 by the grooves GV extending in the second direction D2.

The metal plate 310 may include stainless steel. However, exemplary embodiments of the present inventive concepts are not limited thereto and the metal plate 310 may include various metals or alloys.

The elastic plate 320 is disposed between the metal plate 310 and the display panel module 400. The elastic plate 320 may cover a step generated depending on sliding motion of the sliders 210 and 220, and may provide a flat surface to the display panel module 400. In an exemplary embodiment, the elastic plate 320 may include a thermoplastic polyurethane resin. However, exemplary embodiments of the present inventive concepts are not limited thereto and the elastic plate 320 may include various other elastic materials.

Figure 15:
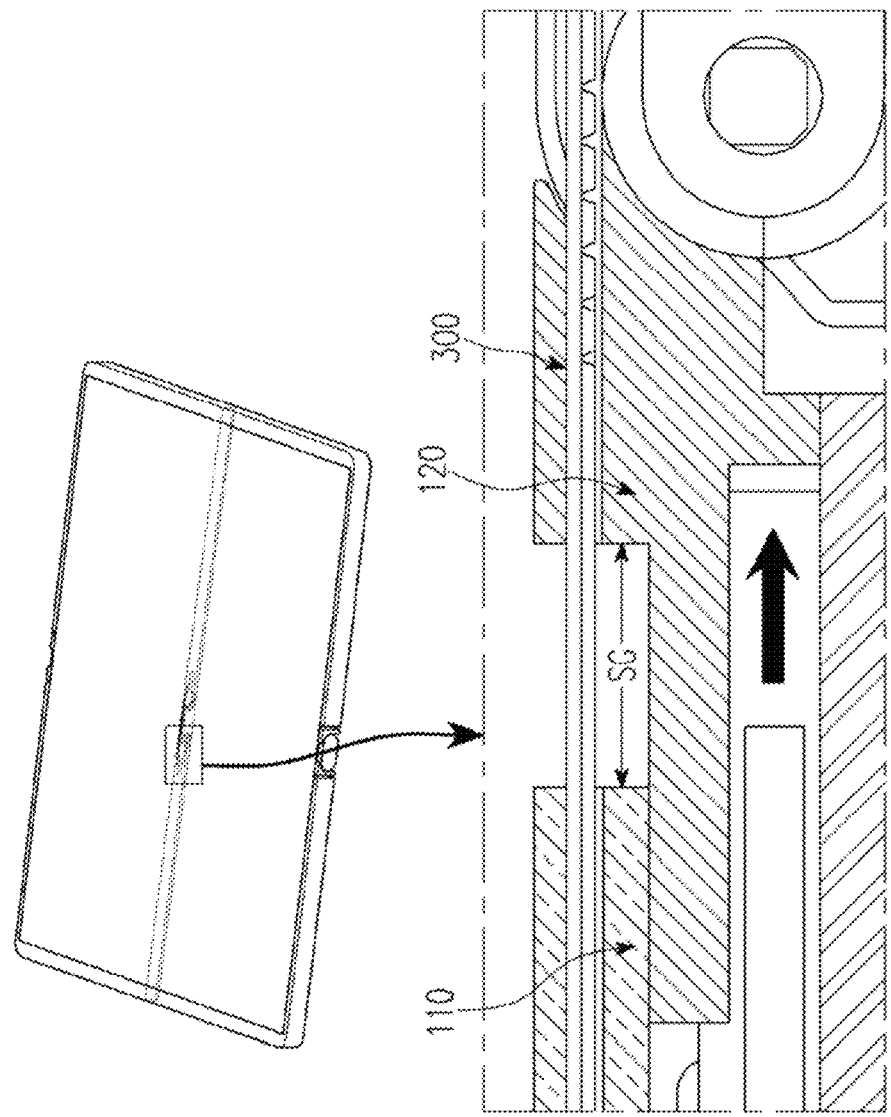
FIG. 15 illustrates a cross-sectional view showing a state in which a foldable plate covers a slide gap between a support plate and a hinge cover according to an exemplary embodiment of the present inventive concepts.

As illustrated in FIG. 15, a slide gap SG exists between the support plate 110 and the hinge cover 120 as the support plate 110 is connected to the second slider 220 and moves together with the second slider 220. The slide gap SG provides a moving space through which the support plate 110 may slide. The slide gap SG is minimized in the folded state, and is maximized in the unfolded state. A step is generated by the slide gap SG. However, the foldable plate 300 is configured to cover the step. Since the foldable plate 300 supports the display panel module 400 on the step as a flat surface, the display panel module 400 is not affected by the step.

Hereinafter, the support housing 100 will be described with reference to the exemplary embodiments of FIG. 16 and FIG. 17.

Figure 16:
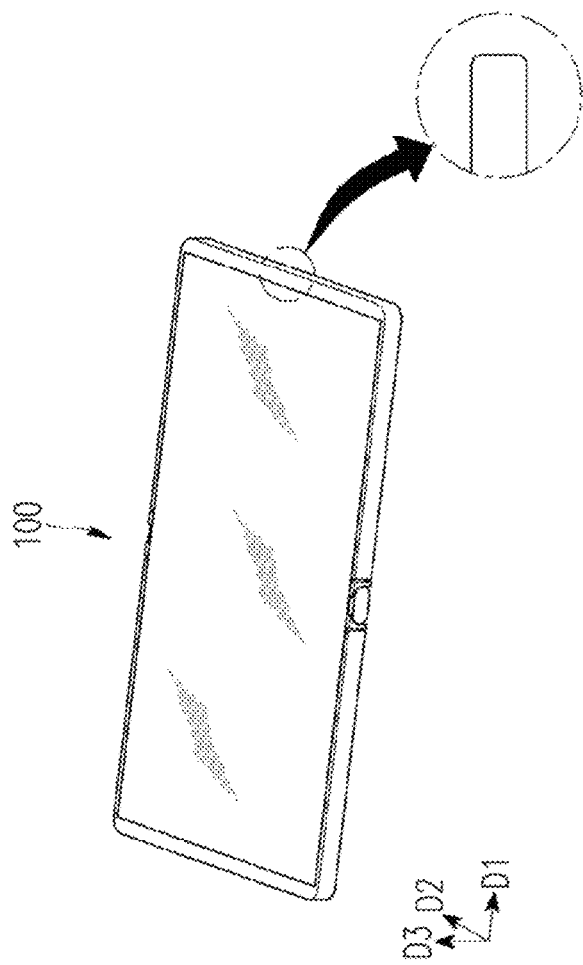
FIG. 16 illustrates a perspective view of a support housing and an enlarged view of a side portion of the support housing according to an exemplary embodiment of the present inventive concepts.

FIG. 16 illustrates a perspective view of a support housing and an enlarged view of a side portion of the support housing according to an exemplary embodiment of the present invention. FIG. 17 illustrates a perspective view of a support housing and an enlarged view of a side portion of the support housing according to another exemplary embodiment of the present invention.

As illustrated in FIG. 16, the support housing 100 may be formed such that a side surface thereof connecting an upper surface and a lower surface is vertically formed (e.g., extending in the third direction D3).

Figure 17:
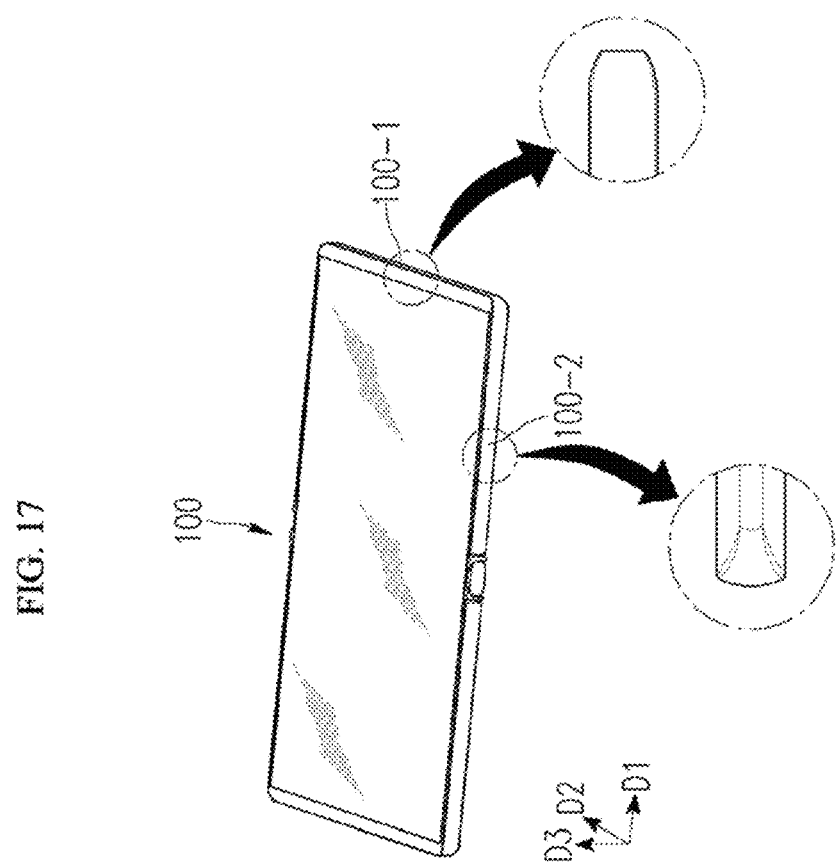
FIG. 17 illustrates a perspective view of a support housing and an enlarged view of a side portion of the support housing according to according to an exemplary embodiment of the present inventive concepts.

Alternatively, as illustrated in FIG. 17, a first side surface 100-1 and a second side surface 100-2 connecting the upper and lower surfaces of the support housing 100 may include curved surfaces. The first side surface 100-1 may be a side surface that is parallel to the rotation axis (e.g., extends in the second direction D2), and the second side surface 100-2 may be a side surface that is perpendicular to the rotation axis (e.g., extends in the first direction D1). The first side surface 100-1 may include a curved surface facing the side surface at the upper surface (e.g., in the third direction D3), a curved surface facing the side surface at the lower surface (e.g., in the third direction D3), and the side surface vertically connecting ends of the two curved surfaces and extending in the third direction D3. The second side surface 100-2 may include a curved side surface that convexly connects the end of the upper surface and the end of the lower surface.

While exemplary embodiments of the present inventive concepts have been particularly shown and described with reference to the accompanying drawings, the specific terms used herein are only for the purpose of describing the invention and are not intended to define the meanings thereof or be limiting of the scope of the invention set forth in the claims. Therefore, those skilled in the art will understand that various modifications and other equivalent embodiments of the present invention are possible.

What is claimed is:

1. A foldable display device comprising:
   a hinge;
   a support plate connected to opposite ends of the hinge; and
   a display panel module disposed on the support plate,
   wherein the hinge includes:
   a rotation axis module having a rotation axis;
   a first slider connected to the rotation axis, the first slider including a first guide line;
   a second slider connected to the support plate, the second slider including a second guide line that extends further away from the first slider and the rotation axis module than the first guide line;
   a link arm including a link arm body, the link arm body having a link arm rotation axis disposed at a first end of the link arm body and a link arm pin hole disposed at a second end of the link arm body; and a link arm pin extending through the link arm pin hole, the first guide line and the second guide line.

2. The foldable display device of claim 1, wherein the first slider rotates about the rotation axis, and the link arm rotates about the link arm rotation axis, wherein the rotation axis is spaced apart from the link arm rotation axis.

3. The foldable display device of claim 1, wherein the link arm body includes a portion that is bent at a portion of the link arm body adjacent the first end and the link arm rotation axis is protruded at the bent portion in a direction that is parallel to the rotation axis.

4. The foldable display device of claim 1, wherein
the first slider includes a first sidewall on which the first guide line is positioned, the first guide line comprising a first slit that is declined toward the rotation axis from an upper side toward a lower side of the first sidewall, and
the second slider includes a second sidewall on which the second guide line is positioned, the second guide line comprising a second slit that is inclined in a direction toward the rotation axis from a lower side toward an upper side of the second sidewall.

5. The foldable display device of claim 1, wherein
the rotation axis module includes:
a shaft and a gear that form the rotation axis, the shaft including a connection shaft and a main shaft, the gear including a main gear disposed between the connection shaft and the main shaft;
a rotary cam coupled to the shaft; and
a fixed cam engaged with the rotary cam.

6. The foldable display device of claim 5, wherein the rotation axis module further includes at least one spring providing a biasing force on the fixed cam to connect the fixed cam and the rotary cam.

7. The foldable display device of claim 5, wherein the foldable display device includes a second shaft and a second gear that form a second rotation axis.

8. The foldable display device of claim 7, wherein the rotation axis module further includes two pinion gears disposed between the shaft and gear and second shaft and second gear to allow the shaft and gear and second shaft and second gear to rotate together.

9. The foldable display device of claim 5, wherein the first slider further includes a rotation axis connector that protrudes toward the rotation axis, the rotation axis connector connects to the connection shaft.

10. The foldable display device of claim 9, wherein:
the rotation axis module further includes a gear cover having a through hole that extends through the connection shaft and includes a stopper that protrudes from edges of the through hole; and
the rotation axis connector engaging with the stopper when the first slider is in an unfolded state.

11. The foldable display device of claim 1, further comprising a foldable plate disposed between the support plate and the display panel module.

12. The foldable display device of claim 11, wherein the foldable plate includes:
a metal plate disposed on the support plate; and
an elastic plate disposed on the metal plate.

13. The foldable display device of claim 12, wherein the metal plate includes:
a pattern portion forming a curved surface in a folded state and including a bar-shaped pattern in a direction that is parallel to the rotation axis;

a first support portion corresponding to the support plate; and
a second support portion corresponding to a portion between the two rotation axes of the hinge.

14. The foldable display device of claim 12, wherein the elastic plate includes a thermoplastic polyurethane resin.

15. The foldable display device of claim 12, wherein the foldable plate further includes an adhesive layer adhering the first support portion to the support plate and adhering the second support portion to the hinge cover covering the hinge.

16. The foldable display device of claim 1, wherein the hinge rotates the support plates at opposite ends thereof so that display surfaces of the display panel module face outward.

17. A foldable display device comprising:
a first slider having a first sidewall and a first guide line formed on the first sidewall, the first slider rotates about a rotation axis;
a second slider having a second sidewall and a second guide line formed on the second sidewall, the second slider slides together with the first slider;
a link arm pin extending through the first guide line and the second guide line; and
a link arm connecting at a first end to the link arm pin and rotating about a link arm rotation axis positioned at a second end, the link arm rotation axis is spaced apart from the rotation axis.

18. The foldable display device of claim 17, wherein the first guide line and the second guide line comprise slits that are inclined in different directions with respect to the rotation axis.

19. The foldable display device of claim 17, wherein when the first slider rotates about the rotation axis, the link arm pin moves along the first guide line and the second guide line and the second slider slides on the first slider.

20. The foldable display device of claim 17, further comprising:
a support plate connected to the second slider;
a foldable plate disposed on the support plate; and
a display panel module disposed on the foldable plate,
wherein the foldable plate includes a pattern corresponding to a portion forming a curved surface in a folded state.

21. A hinge for a foldable display device comprising:
a rotation axis module having a rotation axis;
a first slider connected to the rotation axis, the first slider including a first guide line;
a second slider including a second guide line;
a link arm including a link arm body having a link arm rotation axis disposed at a first end of the link arm body and a link arm pin hole disposed at a second end of the link arm body; and
a link arm pin extending through the link arm pin hole, the first guide line and the second guide line,
wherein the link arm rotation axis is spaced apart from the rotation axis, and
when the first slider rotates about the rotation axis, the link arm pin moves along the first guide line and the second guide line and the second slider slides on the first slider.

* * * * *